(12) United States Patent
He et al.

(10) Patent No.: US 11,290,094 B2
(45) Date of Patent: Mar. 29, 2022

(54) HIGH-LINEARITY INPUT BUFFER

(71) Applicant: MediaTek Singapore Pte. Ltd., Singapore (SG)

(72) Inventors: Tao He, San Jose, CA (US); Chan-Hsiang Weng, Hsinchu (TW); Su-Hao Wu, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/077,066

(22) Filed: Oct. 22, 2020

(65) Prior Publication Data

US 2021/0152164 A1 May 20, 2021

Related U.S. Application Data

(60) Provisional application No. 62/937,830, filed on Nov. 20, 2019.

(51) Int. Cl.
*H03K 5/02* (2006.01)
*H03K 19/0175* (2006.01)

(52) U.S. Cl.
CPC ....... *H03K 5/02* (2013.01); *H03K 19/017509* (2013.01)

(58) Field of Classification Search
CPC .............. H03K 5/02; H03K 19/017509
USPC ........................................ 327/333
See application file for complete search history.

(56) References Cited

U.S. PATENT DOCUMENTS

| 9,564,874 | B1* | 2/2017 | Alzaher | H03H 11/1256 |
| 2011/0304393 | A1* | 12/2011 | Luff | H03F 3/4508 |
| | | | | 330/253 |
| 2012/0049951 | A1* | 3/2012 | Venkataraman | H03F 3/505 |
| | | | | 330/112 |
| 2013/0062962 | A1* | 3/2013 | Xue | H02J 5/005 |
| | | | | 307/104 |
| 2015/0077188 | A1* | 3/2015 | Zhan | H03F 3/505 |
| | | | | 330/307 |
| 2020/0012308 | A1* | 1/2020 | Chen | G05F 1/563 |

OTHER PUBLICATIONS

Surkanti, P. R. et al. "On the analysis of low output impedance characteristic of flipped voltage follower (FVF) and FVF LDOs." 2017 IEEE 60th International Midwest Symposium on Circuits and Systems (MWSCAS) (2017): 17-20. (Year: 2017).*

(Continued)

*Primary Examiner* — Ryan Jager
(74) *Attorney, Agent, or Firm* — McClure, Qualey & Rodack, LLP

(57) ABSTRACT

An input buffer using a frequency dependent impedance circuit to compensate for nonlinearity in low frequency is shown. In a pseudo-differential architecture, a frequency-dependent impedance circuit is coupled between the drain of a positive input transistor of the flipped voltage follower and the drain of a negative input transistor of the flipped voltage follower. In a single-ended architecture, the frequency-dependent impedance circuit is coupled between the drain of an input transistor of the flipped voltage follower and an alternating current ground. The frequency-dependent impedance circuit includes a capacitor.

13 Claims, 4 Drawing Sheets

(56) References Cited

OTHER PUBLICATIONS

Hinojo, J.M., Lujan-Martinez, C., Torralba, A. and Ramirez-Angulo, J. (2017), FVF-Based Low-Dropout Voltage Regulator with Fast Charging/Discharging Paths for Fast Line and Load Regulation. ETRI Journal, 39: 373-382. https://doi.org/10.4218/etrij.17.0116.0766 (Year: 2017).*

Urvashi Singh, Maneesha Gupta, High frequency flipped voltage follower with improved performance and its application, Microelectronics Journal, vol. 44, Issue 12, 2013, pp. 1175-1192, ISSN 0026-2692, https://doi.org/10.1016/j.mejo.2013.08.002. (Year: 2013).*

A CMOS Transconductor with Multidecade Tuning Using Balanced Current Scaling in Moderate Inversion; May 2005 pp. 1-6. (Year: 2005).*

Vaz, B., et al.; "A 13b 4GS/s Digitally Assisted Dynamic 3-Stage Asynchronous Pipelined-SAR ADC;" 2017 IEEE International Solid-State Circuits Conference; Feb. 2017; pp. 276-278.

Hershberg, B., et al.; "A 3.2GS/s 10 ENOB 61mW Ringamp ADC in 16nm with Background Monitoring of Distortion;" 2019 IEEE International Solid-State Circuits Conference; Feb. 2019; pp. 58-60.

Devarajan, S., et al.; "A 12b 10GS/s Interleaved Pipeline ADC in 28nm CMOSTechnology" 2017 IEEE International Solid-State Circuits Conference; Feb. 2017; pp. 288-290.

European Search Report dated Apr. 21, 2016, issued in Application No. 20205040.7.

"A CMOS Transconductor with Multidecade Tuning Using Balanced Current Scaling in Moderate Inversion;" May 2005; pp. 1-6.

"New Improved CMOS Class AB Buffers Based on Differential Flipped Voltage Followers;" May 2006; pp. 1-4.

"A High-Swing, High-Speed CMOS WTA Using Differential Flipped Voltage Followers;" Aug. 2007; pp. 1-5.

* cited by examiner

HIGH-LINEARITY INPUT BUFFER

CROSS REFERENCE TO RELATED APPLICATIONS

This application claims the benefit of U.S. Provisional Application No. 62/937,830, filed on Nov. 20, 2019, the entirety of which is incorporated by reference herein.

BACKGROUND OF THE INVENTION

Field of the Invention

The present invention relates to an input buffer for electrical impedance transformation.

Description of the Related Art

An input buffer (sometimes called a buffer amplifier) is one that provides electrical impedance transformation from one circuit to another, with the aim of preventing the signal source from being affected by whatever currents (or voltages, for a current buffer) that the load may be produced with. The signal is 'buffered from' load currents. Two main types of buffer exist: the voltage buffer and the current buffer.

Voltage follower is one type of voltage buffer, which is a circuit transforming a voltage from a circuit with high output impedance to a circuit with low input impedance. The voltage buffer connected between these two circuits prevents the low input impedance circuit (second one) from loading the first one. Infinite input impedance, zero output impedance, absolute linearity, high speed etc. are the expected features of an ideal voltage buffer.

BRIEF SUMMARY OF THE INVENTION

A flipped voltage follower with high linearity is presented in the disclosure as a high-linearity input buffer.

A high-linearity input buffer in accordance with an exemplary embodiment of the present invention includes a flipped voltage follower configured in a pseudo-differential architecture, and a frequency-dependent impedance circuit coupled between the drain of a positive input transistor of the flipped voltage follower and the drain of a negative input transistor of the flipped voltage follower.

The frequency-dependent impedance circuit may include a capacitor, and may further include a first resistive element and a second resistive element. The drain of the positive input transistor is coupled to a first terminal of the capacitor through the first resistive element. The drain of the negative input transistor is coupled to a second terminal of the capacitor through the second resistive element. The first resistive element and the second resistive element may have the same resistance.

In an exemplary embodiment, the positive input transistor has a gate coupled to a positive differential input of the high-linearity input buffer, and the negative input transistor has a gate coupled to a negative differential input of the high-linearity input buffer. The flipped voltage follower may further have a positive output transistor and a negative output transistor. The positive output transistor has a gate coupled to the drain of the positive input transistor, and a drain coupled to a source of the positive input transistor and outputting a positive differential output of the high-linearity input buffer. The negative output transistor has a gate coupled to the drain of the negative input transistor, and a drain coupled to a source of the negative input transistor and outputting a negative differential output of the high-linearity input buffer. A source of the positive output transistor and a source of the negative output terminal are both coupled to ground.

The flipped voltage follower may further have a first level shifter and a second level shifter. The first level shifter is coupled between the drain of the positive input transistor and the gate of the positive output transistor. The second level shifter is coupled between the drain of the negative input transistor and the gate of the negative output transistor.

The flipped voltage follower may further have a first bias transistor and a second bias transistor. The first bias transistor has a drain coupled to the drain of the positive input transistor. The second bias transistor has a drain coupled to the drain of the negative input transistor. A gate of the second bias transistor is coupled to a gate of the first bias transistor. A source of the second bias transistor and a source of the first bias transistor are both coupled to a voltage source.

In another exemplary embodiment, a high-linearity input buffer includes a flipped voltage follower configured in a single-ended architecture, and a frequency-dependent impedance circuit coupled between the drain of an input transistor of the flipped voltage follower and an alternating current ground.

The frequency-dependent impedance circuit may include a capacitor, and may further include a resistive element. The resistive element and the capacitor are coupled in series between the drain of the input transistor and the alternating current ground.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
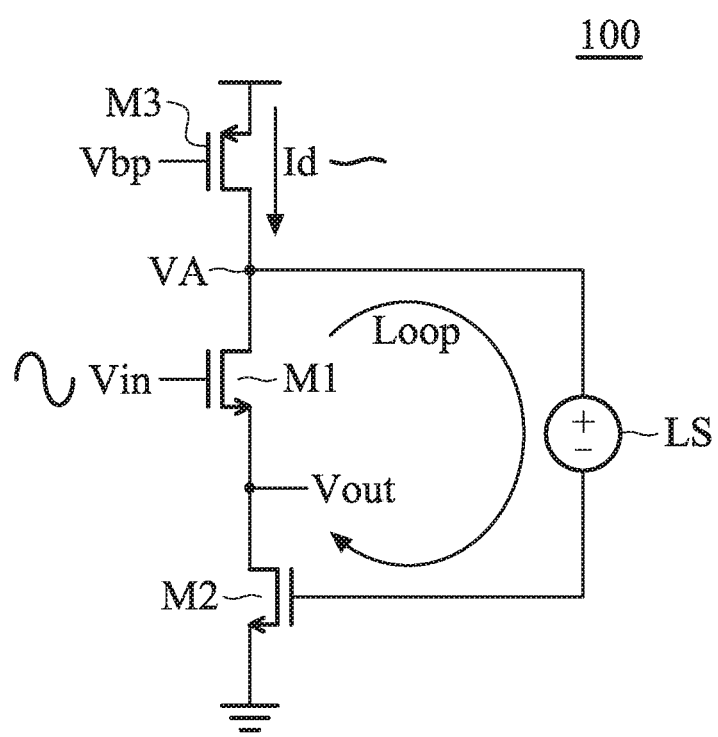
FIG. 1 depicts a flipped voltage follower 100, which includes an input transistor M1, an output transistor M2, a level shifter LS, and a bias transistor M3.

FIG. 1 depicts a flipped voltage follower 100, which includes an input transistor M1, an output transistor M2, a level shifter LS, and a bias transistor M3.

The input transistor M1 has a gate receiving an input voltage Vin. At the drain of the input transistor M1, a signal VA (=gain*Vin') is generated, which is in a reverse phase in comparison with the input voltage Vin. The level shifter LS is coupled between the drain of the input transistor M1 and a gate of the output transistor M2. Through the level shifter LS, the direct current (DC) voltage of the signal VA is pulled down to a proper level to drive the output transistor M2. The output transistor M2 has a drain coupled to a source of the input transistor M1. The bias transistor M3 having a drain coupled to the drain of the input transistor M1, a source coupled to a voltage source and a gate coupled to a bias voltage Vbp provides a driving current Id to the input and output transistors M1 and M2. As shown, the flipped voltage follower 100 outputs an output voltage Vout at the connection point between the input transistor M1 and the output transistor M2.

The flipped voltage follower 100 includes a loop with a loop gain being Aloop. The output impedance Rout of the flipped voltage follower 100 is about 1/(gm1*Aloop), where gm1 is the transconductance of the input transistor M1. By using the loop gain Aloop to provide a high gain, the output impedance Rout is suppressed to a low level. Thus, the flipped voltage follower 100 is suitable to be used as an input buffer which performs high-to-low resistance transformation.

However, a huge-sized input transistor M1 is required in the flipped voltage follower 100 to reduce output impedance and noise. The signals in the flipped voltage follower 100 may swing with the input voltage Vin due to the large parasitic capacitors of the input transistor M1. The driving current Id may be a signal-dependent current, which results harmonic waves.

Figure 2:
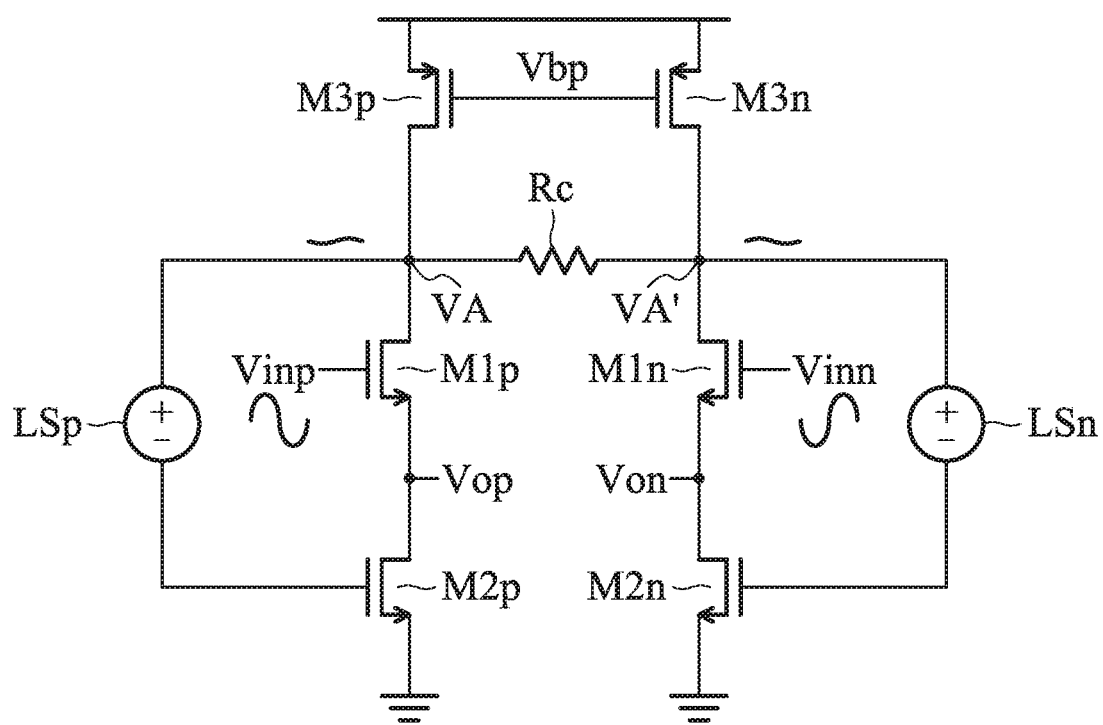
FIG. 2 depicts a flipped voltage follower 200 which suppresses the harmonic waves.

FIG. 2 depicts a flipped voltage follower 200 which suppresses the harmonic waves. The flipped voltage follower 200 is in a pseudo-differential architecture. The signal VA at the drain of a positive input transistor M1$p$ is in a reverse phase in comparison with the signal VA' at the drain of a negative input transistor M1$n$. A resistor Rc is coupled between the drain of the positive input transistor M1$p$ and the drain of the negative input transistor M1$n$. By the resistor Rc, the harmonic waves are canceled.

However, a small resistor Rc is configured in the flipped voltage follower 200 to deliver enough current. In the low frequency response, the loop gain Aloop is significantly suppressed by the small resistor Rc. Thus, the output impedance Rout, about 1/(gm1*Aloop), of the flipped voltage follower 200 is non-ideally increased in the low-frequency region. The capability of high-to-low resistance transformation is reduced.

Figure 3:
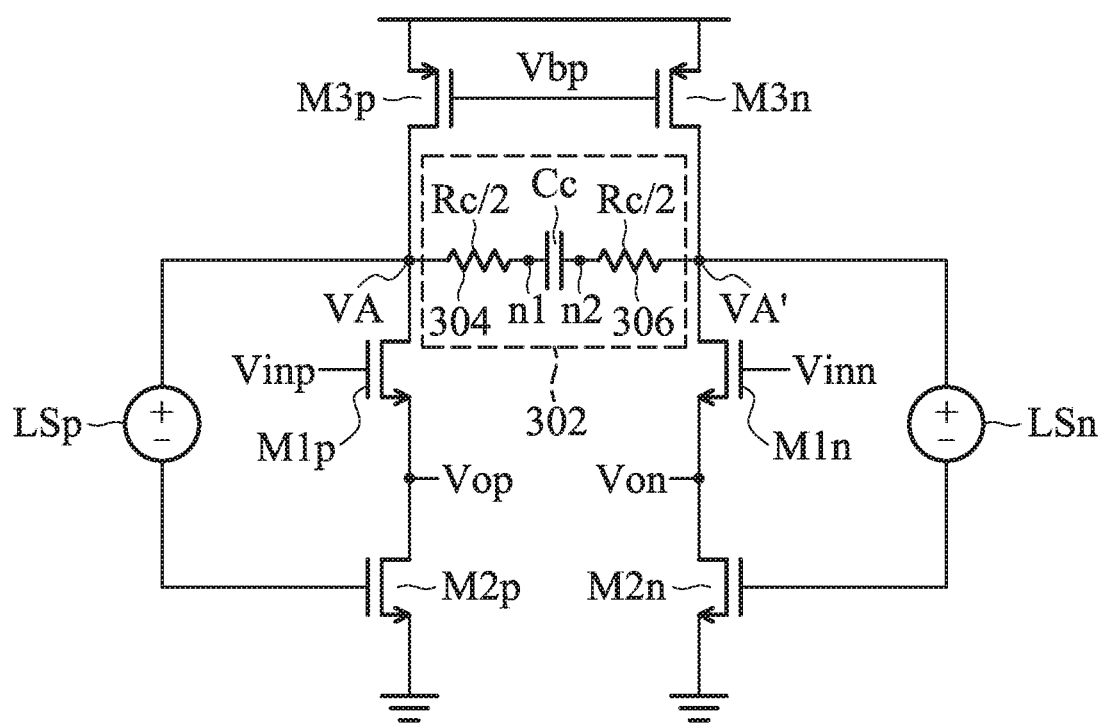
FIG. 3 depicts a flipped voltage follower 300 in accordance with an exemplary embodiment of the present invention.

FIG. 3 depicts a flipped voltage follower 300 in accordance with an exemplary embodiment of the present invention. The flipped voltage follower 300 is in a pseudo-differential architecture. The device coupled between the drain of the positive input transistor M1$p$ and the drain of the negative input transistor M1$n$ is a frequency-dependent impedance circuit 302, which includes a first resistor 304, a capacitor Cc, and a second resistor 306. The capacitor Cc provides significant impedance in the low-frequency region to prevent the drop of the loop gain Aloop, so that the output impedance Rout of the flipped voltage follower 300 is kept low. The flipped voltage follower 300 is suitable to be used as a high-linearity input buffer which performs perfect high-to-low resistance transformation.

In FIG. 3, the drain of the positive input transistor M1$p$ is coupled to a first terminal n1 of the capacitor Cc through the first resistor 304, and the drain of the negative input transistor M1$n$ is coupled to a second terminal n2 of the capacitor Cc through the second resistor 306. The first resistor 304 and the second resistor 306 have the same resistance Rc/2. It is not intended to limit the frequency-dependent impedance circuit to the circuit 302 shown in FIG. 3. Any frequency-dependent impedance circuit capable of reducing the output impedance Rout of the entire flipped voltage follower (as well as increasing the loop gain Aloop) can replace the circuit 302 of FIG. 3.

The circuit details of the flipped voltage follower 300 are recited in the following paragraphs.

The positive input transistor M1$p$ has a gate coupled to a positive differential input Vinp of the flipped voltage follower 300. The negative input transistor M1$n$ has a gate coupled to a negative differential input Vinn of the flipped voltage follower 300.

The flipped voltage follower 300 further has a positive output transistor M2$p$, a negative output transistor M2$n$, a first level shifter LSp and a second level shifter LSn. The first level shifter LSp is coupled between the drain of the positive input transistor M1$p$ and a gate of the positive output transistor M2$p$. The second level shifter LSn is coupled between the drain of the negative input transistor M1$n$ and a gate of the negative output transistor M2$n$. In some exemplary embodiments, other components may replace the level shifters LSp and LSn to couple the drain of the positive input transistor M1$p$ to the gate of the positive output transistor M2$p$, and couple the drain of the negative input transistor M1$n$ to the gate of the negative output transistor M2$n$. As shown, the flipped voltage follower 300 outputs a positive differential output Vop at the connection point between the positive input transistor M1$p$ and the positive output transistor M2$p$, and a negative differential output Von at the connection point between the negative input transistor M1$n$ and the negative output transistor M2$n$.

The flipped voltage follower 300 further has a first bias transistor M3$p$ and a second bias transistor M3$n$. The first bias transistor M3$p$ has a drain coupled to the drain of the positive input transistor M1$p$. The second bias transistor M3$n$ has a drain coupled to the drain of the negative input transistor M1$n$. A gate of the second bias transistor M3$n$ is coupled to a gate of the first bias transistor M3$p$. A source of the second bias transistor M3$n$ and a source of the first bias transistor M3$p$ are both coupled to a voltage source.

There may be variations of the flipped voltage follower 300. Any pseudo-differential flipped voltage follower including a frequency-dependent impedance circuit (e.g., the circuit 302) coupled between the drain of a positive input transistor and the drain of a negative input transistor should be considered within the scope of the present invention.

Figure 4:
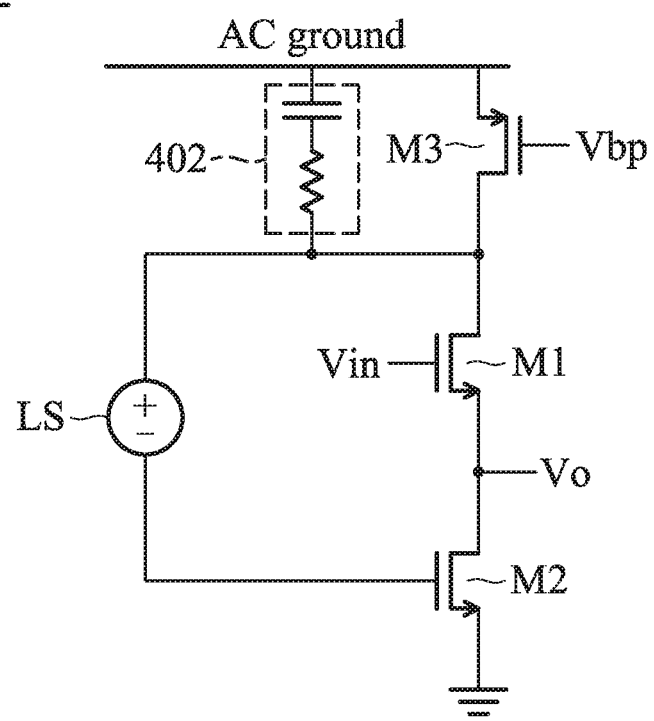
FIG. 4 depicts a flipped voltage follower 400 in accordance with another exemplary embodiment of the present invention.

FIG. 4 depicts a flipped voltage follower 400 in accordance with another exemplary embodiment of the present invention. The flipped voltage follower 400 is in a single-ended architecture. A frequency-dependent impedance circuit (whose impedance is z(w)) 402 is coupled between the drain of an input transistor M1 of the flipped voltage follower 400 and an alternating current ground (e.g., a voltage source or the ground). The frequency-dependent impedance circuit 402 includes a capacitor and a resistor which are coupled in series between the drain of the input transistor M1 and the alternating current ground. The capacitor Cc provides significant impedance in the low-frequency region to prevent the drop of the loop gain Aloop, so that the output impedance Rout of the flipped voltage follower 400 is kept low. The flipped voltage follower 400 is suitable to be used as a high-linearity input buffer which performs perfect high-to-low resistance transformation.

The circuit details of the flipped voltage follower 400 are recited in these paragraphs. The input transistor M1 has a gate that receives an input voltage Vin of the flipped voltage follower 400. The flipped voltage follower 400 further has an output transistor M2, a level shifter LS, and a bias transistor M3. The output transistor M3 has a gate coupled to the drain of the input transistor M1 with the level shifter LS coupled between the drain of the input transistor M1 and the gate of the output transistor M2. The drain of the output transistor M2 is coupled to a source of the input transistor M1 to output an output voltage Vo of the flipped voltage follower 400. The bias transistor M3 has a drain coupled to the drain of the input transistor M1, a source coupled to the alternating current ground, and a gate biased by a bias voltage Vbp.

There may be variations of the flipped voltage follower 400. Any single-ended flipped voltage follower including a frequency-dependent impedance circuit (e.g., the circuit 402) coupled between the drain of an input transistor and an alternating current ground should be considered within the scope of the present invention.

The resistors mentioned in the specification may be any resistive element.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-linearity input buffer, comprising:
a flipped voltage follower, configured in a pseudo-differential architecture; and
a frequency-dependent impedance circuit, coupled between a drain of a positive input transistor of the flipped voltage follower and a drain of a negative input transistor of the flipped voltage follower,
wherein the frequency-dependent impedance circuit further includes at least one resistive element coupled in series with a frequency-dependent impedance element of the frequency-dependent impedance circuit between the drain of the positive input transistor and the drain of the negative input transistor.

2. The high-linearity input buffer as claimed in claim 1, wherein:
the frequency-dependent impedance element is a capacitor.

3. The high-linearity input buffer as claimed in claim 2, wherein:
the frequency-dependent impedance circuit includes a first resistive element and a second resistive element;
the drain of the positive input transistor is coupled to a first terminal of the capacitor through the first resistive element; and
the drain of the negative input transistor is coupled to a second terminal of the capacitor through the second resistive element.

4. The high-linearity input buffer as claimed in claim 3, wherein:
the first resistive element and the second resistive element have the same resistance.

5. The high-linearity input buffer as claimed in claim 3, wherein:
the positive input transistor has a gate coupled to a positive differential input of the high-linearity input buffer; and
the negative input transistor has a gate coupled to a negative differential input of the high-linearity input buffer.

6. The high-linearity input buffer as claimed in claim 5, wherein the flipped voltage follower further comprises:
a positive output transistor, having a gate coupled to the drain of the positive input transistor, and a drain coupled to a source of the positive input transistor and outputting a positive differential output of the high-linearity input buffer; and
a negative output transistor, having a gate coupled to the drain of the negative input transistor, and a drain coupled to a source of the negative input transistor and outputting a negative differential output of the high-linearity input buffer,
wherein a source of the positive output transistor and a source of the negative output terminal are both coupled to ground.

7. The high-linearity input buffer as claimed in claim 6, wherein the flipped voltage follower further comprises:
a first level shifter, coupled between the drain of the positive input transistor and the gate of the positive output transistor; and
a second level shifter, coupled between the drain of the negative input transistor and the gate of the negative output transistor.

8. The high-linearity input buffer as claimed in claim 7, wherein the flipped voltage follower further comprises:
a first bias transistor, having a drain coupled to the drain of the positive input transistor; and
a second bias transistor, having a drain coupled to the drain of the negative input transistor,
wherein:
a gate of the second bias transistor is coupled to a gate of the first bias transistor; and
a source of the second bias transistor and a source of the first bias transistor are both coupled to a voltage source.

9. A high-linearity input buffer, comprising:
a flipped voltage follower, configured in single-ended architecture; and
a frequency-dependent impedance circuit, coupled between a drain of an input transistor of the flipped voltage follower and an alternating current ground,
wherein:
the frequency-dependent impedance circuit includes a capacitor;
the frequency-dependent impedance circuit further includes a resistive element; and
the resistive element and the capacitor are coupled in series between the drain of the input transistor and the alternating current ground.

10. The high-linearity input buffer as claimed in claim 9, wherein:
the input transistor has a gate coupled to an input voltage of the high-linearity input buffer.

11. The high-linearity input buffer as claimed in claim 10, wherein the flipped voltage follower further comprises:
an output transistor, having a gate coupled to the drain of the input transistor, and a drain coupled to a source of the input transistor and outputting an output voltage of the high-linearity input buffer.

12. The high-linearity input buffer as claimed in claim 11, wherein the flipped voltage follower further comprises:
a level shifter, coupled between the drain of the input transistor and the gate of the output transistor.

13. The high-linearity input buffer as claimed in claim 12, wherein the flipped voltage follower further comprises:

a bias transistor, having a drain coupled to the drain of the input transistor, a source coupled to the alternating current ground, and a gate biased by a bias voltage.

* * * * *